(12) United States Patent
Tsao

(10) Patent No.: US 9,086,856 B2
(45) Date of Patent: Jul. 21, 2015

(54) SERVER HAVING CARRIER AND POWER MODULE

(71) Applicant: Winstron Corporation, New Taipei (TW)

(72) Inventor: Yu-Tung Tsao, New Taipei (TW)

(73) Assignee: WINSTRON CORPORATION, New Taipei (TW)

( * ) Notice: Subject to any disclaimer, the term of this patent is extended or adjusted under 35 U.S.C. 154(b) by 359 days.

(21) Appl. No.: 13/830,965

(22) Filed: Mar. 14, 2013

(65) Prior Publication Data

US 2013/0265714 A1 Oct. 10, 2013

(30) Foreign Application Priority Data

Apr. 9, 2012 (TW) .............................. 101206374 U

(51) Int. Cl.
| | |
|---|---|
| H05K 7/00 | (2006.01) |
| G06F 1/18 | (2006.01) |
| A47B 95/02 | (2006.01) |
| G06F 1/20 | (2006.01) |
| H05K 7/14 | (2006.01) |

(52) U.S. Cl.
CPC .................. *G06F 1/181* (2013.01); *A47B 95/02* (2013.01); *G06F 1/187* (2013.01); *G06F 1/188* (2013.01); *G06F 1/20* (2013.01); *H05K 7/1487* (2013.01)

(58) Field of Classification Search
USPC .......... 361/679.02, 679.31–679.54, 688–723, 361/752, 760, 831
See application file for complete search history.

(56) References Cited

U.S. PATENT DOCUMENTS

| | | | | |
|---|---|---|---|---|
| 7,327,565 | B2* | 2/2008 | Chen et al. | 361/679.33 |
| 7,495,904 | B2* | 2/2009 | Liang et al. | 361/679.39 |
| 7,639,490 | B2* | 12/2009 | Qin et al. | 361/679.34 |
| 7,688,576 | B2* | 3/2010 | Kim et al. | 361/679.33 |
| 8,004,830 | B2* | 8/2011 | Lu | 361/679.33 |
| 8,462,495 | B1* | 6/2013 | Keefe et al. | 361/679.46 |
| 2002/0101713 | A1* | 8/2002 | Eland | 361/686 |
| 2008/0259554 | A1* | 10/2008 | Qin et al. | 361/685 |
| 2009/0154092 | A1* | 6/2009 | Chen | 361/679.51 |
| 2010/0165564 | A1* | 7/2010 | Lu | 361/679.35 |
| 2011/0122573 | A1* | 5/2011 | Peng et al. | 361/679.48 |

FOREIGN PATENT DOCUMENTS

TW 526946 4/2003

* cited by examiner

*Primary Examiner* — Courtney Smith
(74) *Attorney, Agent, or Firm* — Steptoe & Johnson LLP

(57) ABSTRACT

A carrier for installation in a receiving space of a chassis includes a carrier body having a bottom wall and two sidewalls that cooperatively define a carrying space. The bottom wall has two opposite short sides respectively defining front and rear sides of the carrier body. A front shell is connected to the front side of the carrier body, and includes a front cover plate and two connecting walls extending into the carrying space and respectively and adjustably connected to the sidewalls in an overlapping manner to adjust a distance between the front cover plate and the rear side of the carrier body, so that the length of the carrier corresponds to the depth of the receiving space of the chassis.

20 Claims, 9 Drawing Sheets

SERVER HAVING CARRIER AND POWER MODULE

CROSS-REFERENCE TO RELATED APPLICATION

This application claims priority of Taiwanese Patent Application No. 101206374, filed on Apr. 9, 2012, the disclosure of which is incorporated herein by reference.

BACKGROUND OF THE INVENTION

1. Field of the Invention

This disclosure relates to a blade server and a power module and a carrier thereof, and more particularly to a carrier that has an adjustable length, a power module having the carrier, and a server having the power module.

2. Description of the Related Art

For a conventional blade server, a plurality of carriers may be stacked in one chassis. The carriers are loaded with a storage device or a power supply. Such blade-like carriers are stacked together to reduce a space occupied by the server. In addition, each carrier may be individually withdrawn and installed, which is convenient in maintenance.

Nowadays, the chassis of a server has many specifications with slight difference in depths. The lengths of the carriers must suit the accommodation depth of the chassis so as to be properly installed in the chassis. Therefore, a variety of carriers of different lengths must be fabricated to suit chassis of different accommodation depths. In other words, the existing carrier lacks flexibility so that it is not applicable to chassis of different accommodation depths.

SUMMARY OF THE INVENTION

Therefore, an object of the present disclosure is to provide a carrier that has an adjustable length so as to be applicable to chassis of different accommodation depths.

Another object of the present disclosure is to provide a power module that has a carrier with an adjustable length.

Still another object of the present disclosure is to provide a server that includes a power module having a carrier with an adjustable length.

According to one aspect of this disclosure, a carrier for installation in a receiving space of a chassis of a server comprises a carrier body and a front shell. The carrier body includes a rectangular bottom wall and two sidewalls that extend upwardly and respectively from two opposite long sides of the bottom wall. The bottom wall and the sidewalls cooperatively define a carrying space. The bottom wall has one short side that defines a front side of the carrier body and the other short side that defines a rear side of the carrier body. The front shell is connected to the front side of the carrier body, and includes an upper shell having a front cover plate, a handgrip disposed on the front cover plate, and two connecting walls. The connecting walls extend into the carrying space from the front side of the carrier body and are respectively and adjustably connected to the sidewalls in an overlapping manner to adjust a distance between the front cover plate and the rear side of the carrier body, so that the length of the carrier corresponds to the depth of the receiving space of the chassis.

According to another aspect of this disclosure, a power module for a server comprises a carrier and two power supplies. The carrier includes a carrier body and a front shell. The carrier body includes a rectangular bottom wall and two sidewalls that extend upwardly and respectively from two opposite long sides of the bottom wall. The bottom wall and the sidewalls cooperatively define a carrying space. The bottom wall has one short side that defines a front side of the carrier body and the other short side that defines a rear side of the carrier body. The front shell is connected to the front side of the carrier body, and includes an upper shell having a front cover plate, a handgrip disposed on the front cover plate, and two connecting walls. The connecting walls extend into the carrying space from the front side of the carrier body and are respectively and adjustably connected to the sidewalls in an overlapping manner to adjust a distance between the front cover plate and the rear side of the carrier body. The two power supplies are spaced apart in a front-rear direction and are disposed on the first bottom wall in proximity to the sidewalls, respectively.

According to still another aspect of this disclosure, a server comprises a chassis defining a receiving space and an opening in spatial communication with the receiving space, a heat dissipation module disposed on the chassis opposite to the opening, and at least one power module accommodated in the receiving space of the chassis. The power module includes a carrier and two power supplies. The carrier includes a carrier body and a front shell. The carrier body includes a rectangular bottom wall and two sidewalls that extend upwardly and respectively from two opposite long sides of the bottom wall. The bottom wall and the sidewalls cooperatively define a carrying space. The bottom wall has one short side that defines a front side of the carrier body and the other short side that defines a rear side of the carrier body. The rear side of the carrier body is proximate to the heat dissipation module. The power supplies are spaced apart in a front-rear direction and are disposed on the bottom wall in proximity to the sidewalls, respectively. The front shell is connected to the front side of the carrier, and includes an upper shell having a front cover plate, a handgrip disposed on the front cover plate, and two connecting walls. The connecting walls extend into the carrying space from the front side of the carrier body and are respectively and adjustably connected to the sidewall in an overlapping manner to adjust a distance between the front cover plate and the rear side of the carrier body, so that the length of the carrier corresponds to the depth of the receiving space of the chassis and the front cover plate is located at the opening.

The effect of the present disclosure resides in that, when the carrier body and the front shell are assembled, the entire length of the carrier may be adjusted by adjusting the overlapping areas of the connecting walls of the front shell and the sidewalls of the carrier body, thereby realizing the applicability of the present disclosure to the chassis having the receiving space of different depths. Thus, the use flexibility of the carrier or the power module may be enhanced.

BRIEF DESCRIPTION OF THE DRAWINGS

Other features and advantages of the present disclosure will become apparent in the following detailed description of the embodiment with reference to the accompanying drawings, of which.

DETAILED DESCRIPTION OF THE EMBODIMENT

The above-mentioned and other technical contents, features, and effects of this disclosure will be clearly presented from the following detailed description of one embodiment in coordination with the reference drawings.

Figure 1:
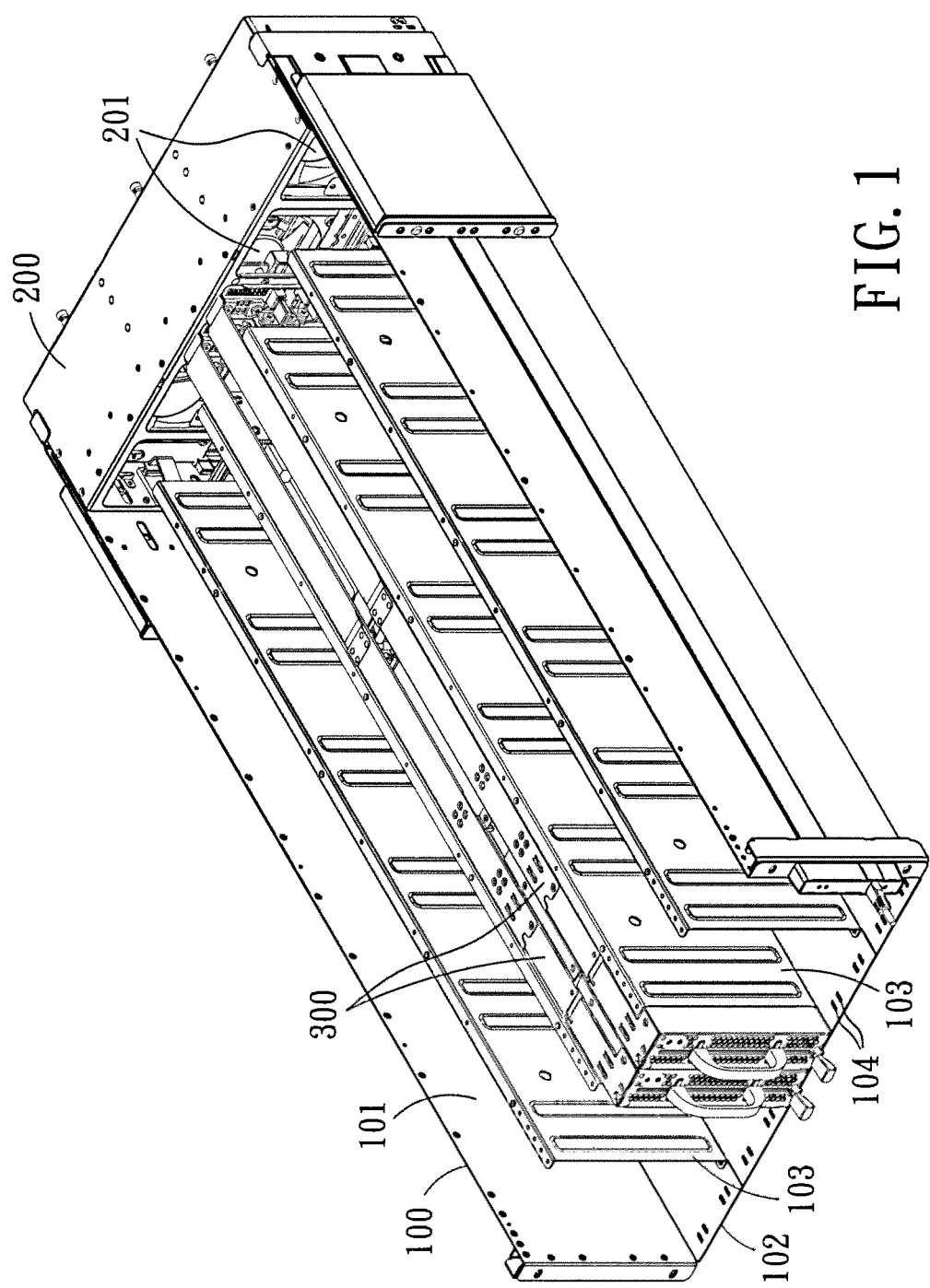
FIG. 1 is a perspective view of a server according to an embodiment of this disclosure.

Referring to FIG. 1, a server according to an embodiment of the present disclosure comprises a chassis 100, a heat dissipation module 200 and two power modules 300. The chassis 100 defines a receiving space 101 and an opening 102 in spatial communication with the receiving space 101. The heat dissipation module 200 is disposed on the chassis 100 opposite to the opening 102, and includes a plurality of fans 201 to ventilate the receiving space 101. The power modules 300 are accommodated in the receiving space 101 of the chassis 100. The chassis 100 includes a plurality of support brackets 103 that partition the receiving space 101 into multiple layers of spaces and that support the power modules 300, and a plurality of modules (not shown) that respectively include a storage device.

Figure 2:
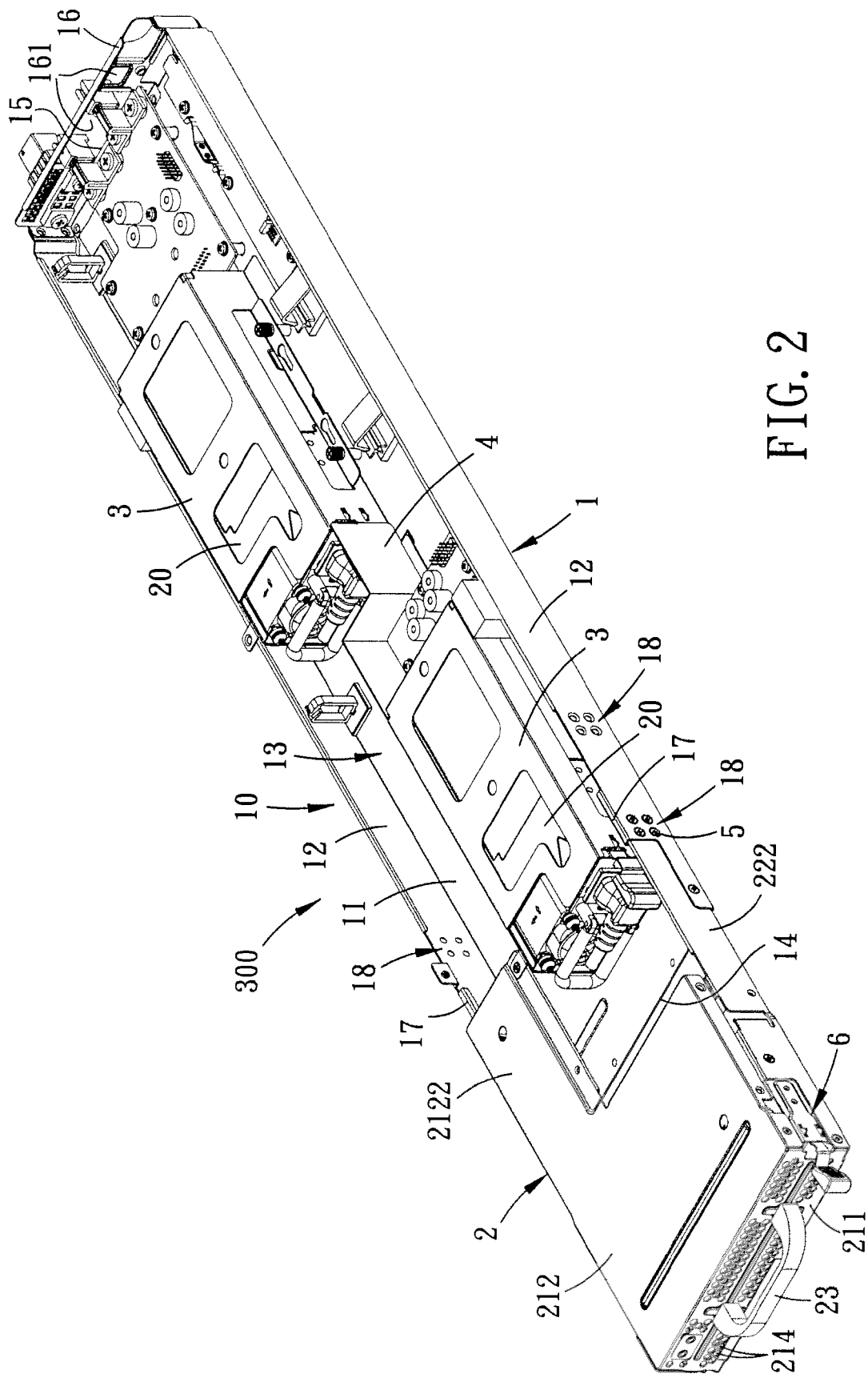
FIG. 2 is a perspective view of a power module of the embodiment.
Figure 3:
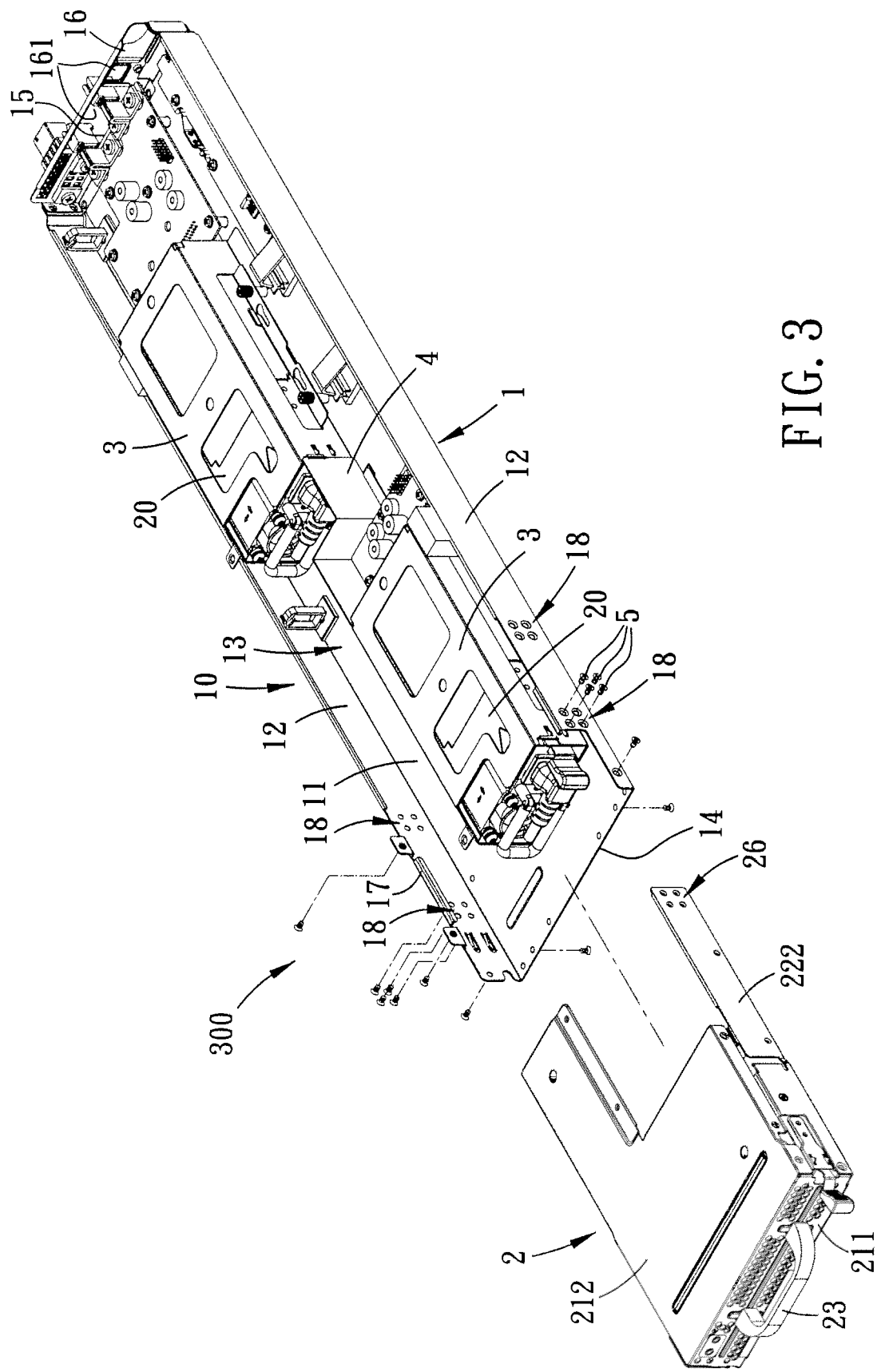
FIG. 3 is a view similar to FIG. 2, but illustrating a front shell of a carrier being detached from a carrier body thereof.

Referring to FIGS. 2 and 3, each of the power modules 300 includes a carrier 10 and two power supplies 20. The carrier 10 includes a carrier body 1, a front shell 2, two limiting shells 3, and a divider 4. The carrier body 1 includes a rectangular first bottom wall 11 and two first sidewalls 12. The first sidewalls 12 extend upwardly and respectively from two opposite long sides of the first bottom wall 11 and that cooperate with the first bottom wall 11 to define a carrying space 13. With one short side of the first bottom wall 11 being defined as a front side 14 of the carrier body 1 and the other short side thereof being defined as a rear side 15 of the carrier body 1, the rear side 15 of the carrier body 1 is close to the heat dissipation module 200 (see FIG. 1). In this embodiment, the carrier body 1 further includes a back wall 16 that extends upwardly from the rear side 15 of the first bottom wall 11. The back wall 16 includes a plurality of through holes 161 for circulation of air or for passage of wires (not shown) that are used to connect with the power supplies 20. The limiting shells 3 are spaced apart in a front-rear direction, and are fixed to the first bottom wall 11 in proximity to the first sidewalls 12, respectively. The limiting shells 3 respectively accommodate the power supplies 20, so that the power supplies 20 are spaced apart in a front-rear direction and are disposed on the first bottom wall 11 in a staggered manner. The divider 4 is connected between sides of the limiting shells 3 that are distal from the first sidewalls 12 to partition the carrying space 13 into two air passages 131. The air passages 131 respectively extend through the power supplies 20. That is, air current formed by the heat dissipation module 200 can flow through the power supplies 20, thus ensuring that both of the power supplies 20 are in contact with the cool air current.

The front shell 2 is connected to the front side 14 of the carrier body 1. Referring to FIGS. 3 to 6, the front shell 2 includes an upper shell 21, a lower shell 22 and a handgrip 23.

The upper shell 21 has a front cover plate 211, a top wall 212 and a second sidewall 213. The front cover plate 211 has a plurality of passage holes 214 for circulation of air. The top wall 212 is L-shaped and is oppositely spaced apart from the first bottom wall 11 of the carrier body 1. The top wall 212 includes a main portion 2121 connected to the front cover plate 211, and an extension portion 2122 extending rearwardly from a part of the main portion 2121. The second sidewall 213 is connected to one end of the front cover plate 211 and a corresponding end of the top wall 212. The upper shell 21 further has a lug portion 213' connected to the front cover plate 211 opposite to the second sidewall 213. The lower shell 22 and the upper shell 21 are interconnected and cooperatively define a flow guide space 25. The flow guide space 25 is used to guide flow of air current within the carrier 10. The lower shell 22 has a second bottom wall 221 and two connecting walls 222 respectively disposed on two opposite ends of the second bottom wall 221. The second bottom wall 221 is oppositely spaced apart from the top wall 212, and has a front side connected to the front cover plate 211. The connecting walls 222 are respectively connected to the second sidewall 213 and the lug portion 213'. The handgrip 23 is disposed on the front cover plate 211 so as to be held by a user, thereby facilitating pulling out of the carrier 10 from the chassis 100.

Figure 7:
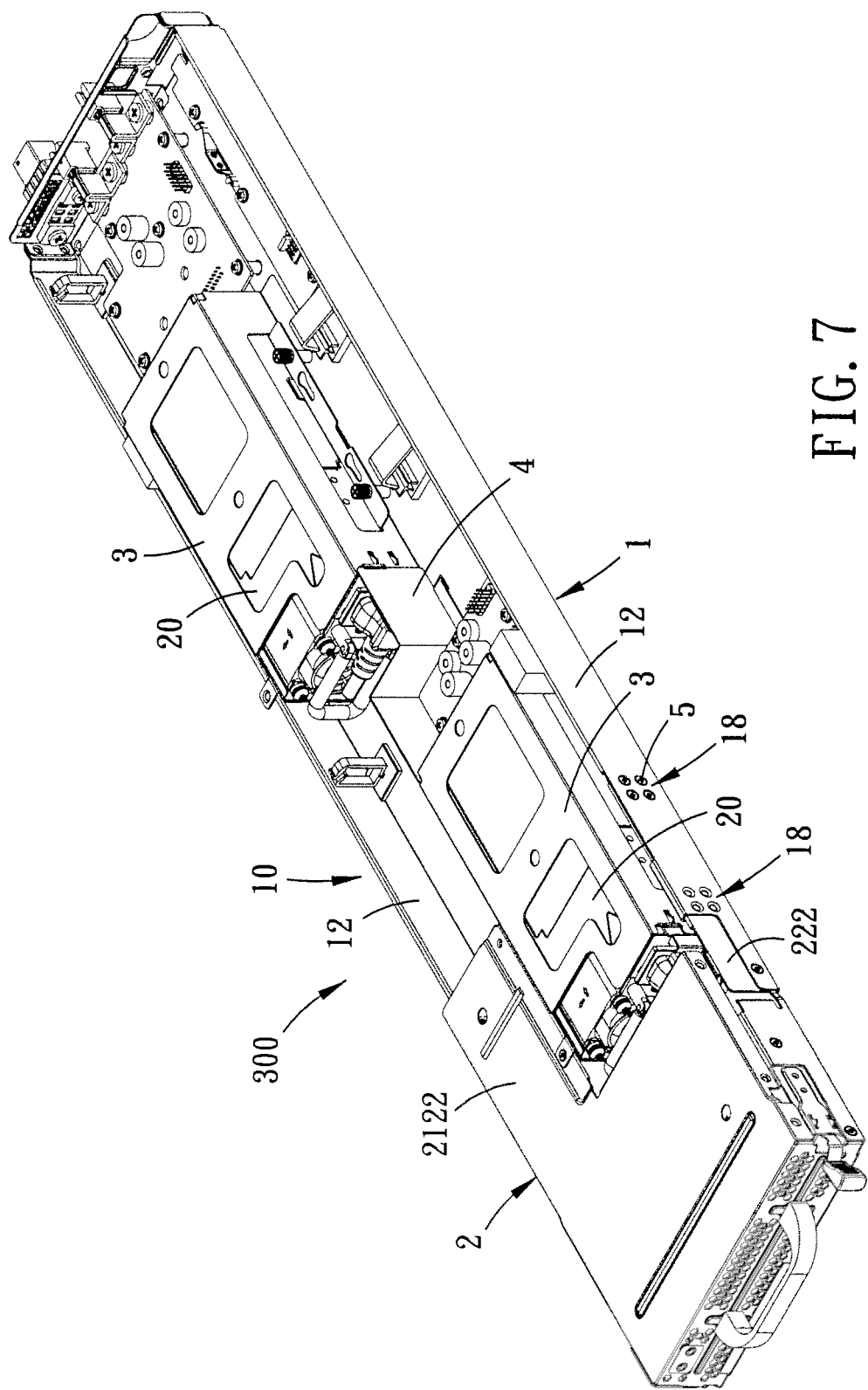
FIG. 7 is a view similar to FIG. 2, but with the length of the carrier being shortened.

With reference to FIGS. 2 and 3, the connecting walls 222 extend into the carrying space 13 from the front side 14 of the carrier body 1, and are respectively and adjustably connected to the first sidewalls 12 in an overlapping manner. The carrier body 1 further includes a pair of stop pieces 17 and a plurality of pairs of first positioning portions 18. The stop pieces 17 are connected respectively to ends of the first sidewalls 12 that are distal from the first bottom wall 11, and cooperate with the first bottom wall 11 to define a pair of guide rails to receive the connecting walls 222, respectively. Further, the stop pieces 17 have a limiting function. Each pair of the first positioning portions 18 are respectively provided on the first sidewalls 12. Further, the first positioning portions 18 that are located on the same one of the first sidewalls 12 are arranged spaced apart from each other along the length of the corresponding first sidewall 12. The front shell 2 further includes a pair of second positioning portions 26 that are respectively disposed on the connecting walls 222. Each of the first and second positioning portions 18, 26 includes a plurality of through holes. The number and location of the through holes in each first positioning portion 18 correspond to those in each second positioning portion 26, such that a plurality of fasteners 5 (for example, screws) can pass through the corresponding through holes to connect the first sidewalls 12 to the respective connecting walls 222. In this embodiment, each of the first and second positioning portions 18, 26 includes four through holes that are arranged in a square shape. The pair of second positioning portions 26 may be selectively connected to one of the pairs of the first positioning portions 18 to adjust overlapping areas of the two connecting walls 222 and the respective first sidewalls 12 and to adjust a distance between the front cover plate 211 and the rear side 15 of the carrier body 1. As such, the length of the carrier 10 can correspond to the depth of the receiving space 101 of the chassis 100, and the front cover plate 211 can be disposed at the opening 102 (see FIG. 1). If the depth of the receiving space 101 of the chassis 100 is deeper, the overlapping areas of the connecting walls 222 and the first sidewalls 12 may be decreased, as shown in FIG. 2, by moving the front shell 2 forwardly to increase the distance between the front cover plate 211 and the rear side 15 of the carrier body 1, thereby increasing the entire length of the carrier 10. If the depth of the receiving space 101 of the chassis 100 is shallower, the overlapping areas of the connecting walls 222 and the first sidewalls 12 may be increased, as shown in FIG. 7, by moving the front shell 2 rearwardly to decrease the distance between the front cover plate 211 and the rear side 15 of the carrier body 1, thereby shortening the entire length of the carrier 10. In this way, the power modules 300 can be applicable to chassis of different sizes.

Figure 4:
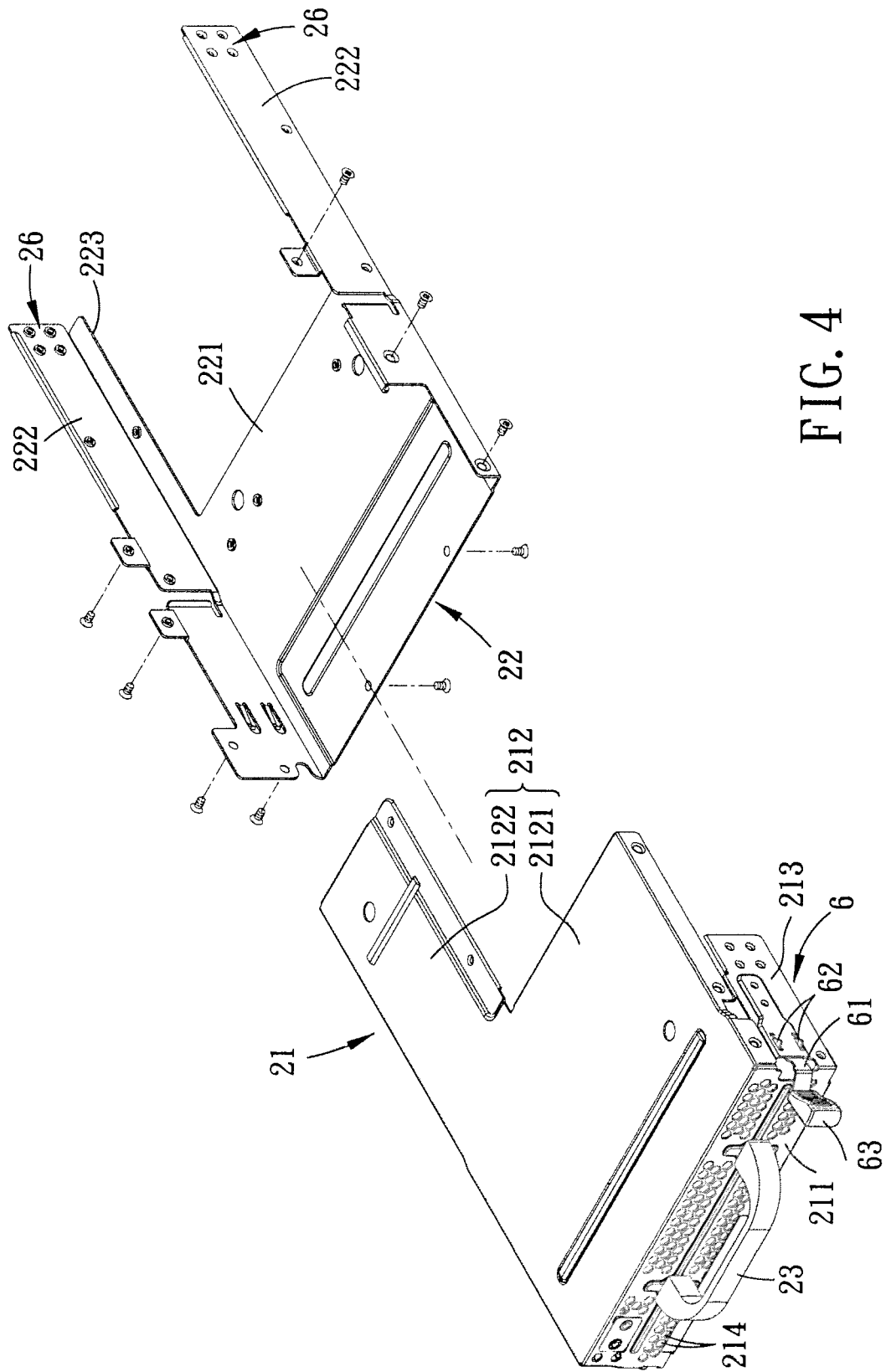
FIG. 4 is an exploded perspective view of the front shell of the carrier.
Figure 5:
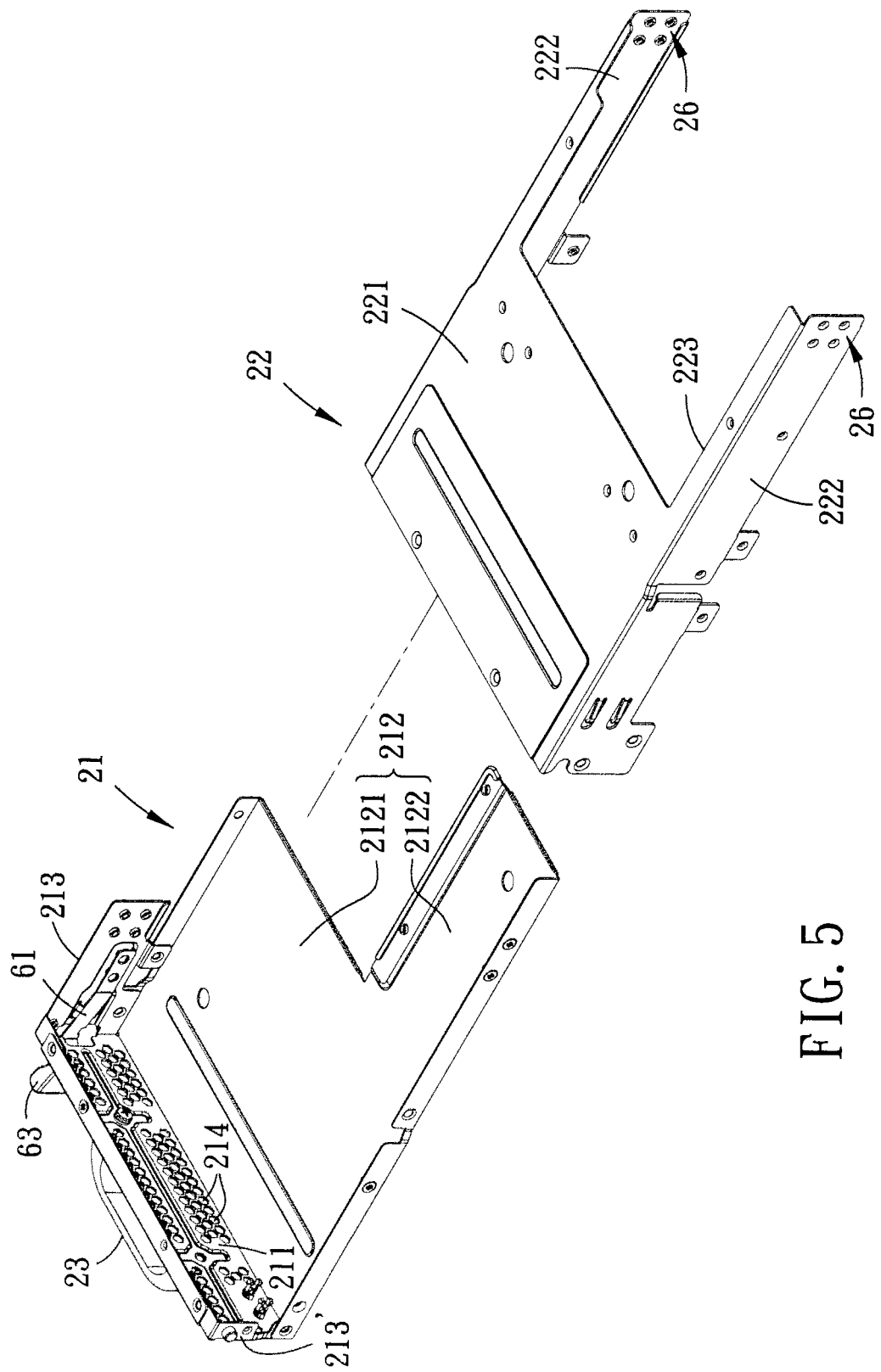
FIG. 5 is a view similar to FIG. 4, but taken from another angle.
Figure 6:
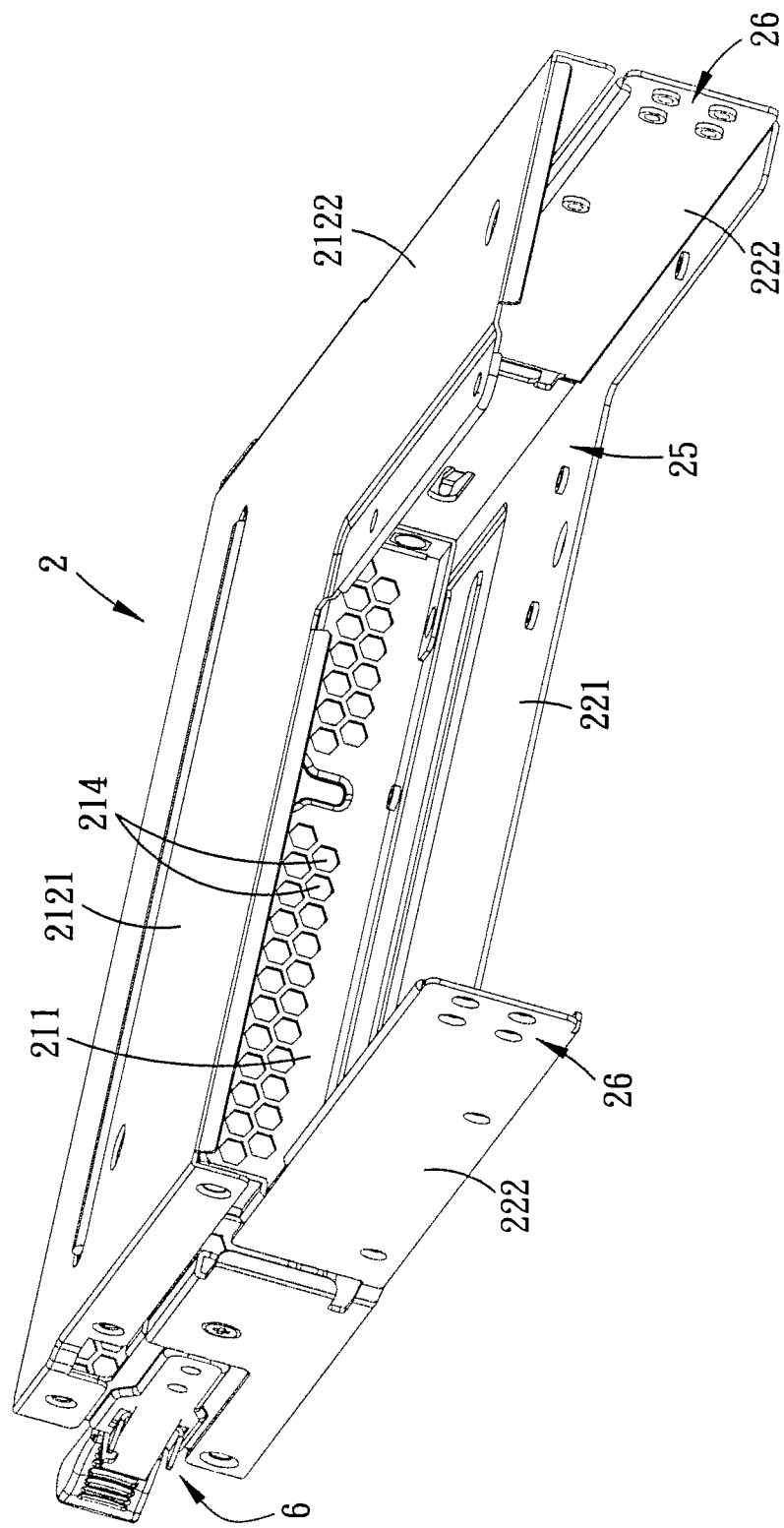
FIG. 6 is a perspective view of the front shell in an assembled state.

With reference to FIGS. 3, 4 and 5, the second bottom wall 221 defines a cutout 223 in a rear portion thereof between the connecting walls 222 to accommodate therein the power supply 20 that is disposed in proximity to the front side 14. Furthermore, referring to FIGS. 2 and 7, when the front shell 2 is connected to the carrier body 1, the extension portion 2122 of the top wall 212 has one side adjacent to one of the first sidewalls 12 and the other side connected to the limiting shell 3 that is disposed in proximity to the front side 14. The extension portion 2122 and the carrier body 1 cooperatively define the air passage 131 that corresponds to the power supply 20 which is disposed in proximity to the rear side 15. Two streams of air current that respectively flow through the power supplies 20 are formed between the front cover plate 211 and the back wall 16.

Moreover, with reference to FIGS. 4 and 5, the carrier 10 further includes a fixing mechanism 6. The fixing mechanism 6 is disposed on the second sidewall 213 of the upper shell 21, and includes a plate-shaped bendable arm 61 adjoining the second sidewall 213, a pair of spaced-apart engaging teeth 62 respectively formed at two long sides of the bendable arm 61 and protruding out of the second sidewall 213, and a pull portion 63 connected to a front end of the bendable arm 61. When the power module 300 is installed in the chassis 100, as shown in FIG. 1, the engaging teeth 62 are respectively engaged to a pair of through holes 104 in a wall of the chassis 100 so as to fix the power module 300 to the chassis 100. When it is desired to remove the power module 300 from the chassis 100, the pull portion 63 is first pulled in a direction toward the handgrip 23 to disengage the engaging teeth 62 from the respective through holes 104. The power module 300 can then be pulled out from the chassis 100 using the handgrip 23.

Figure 8:
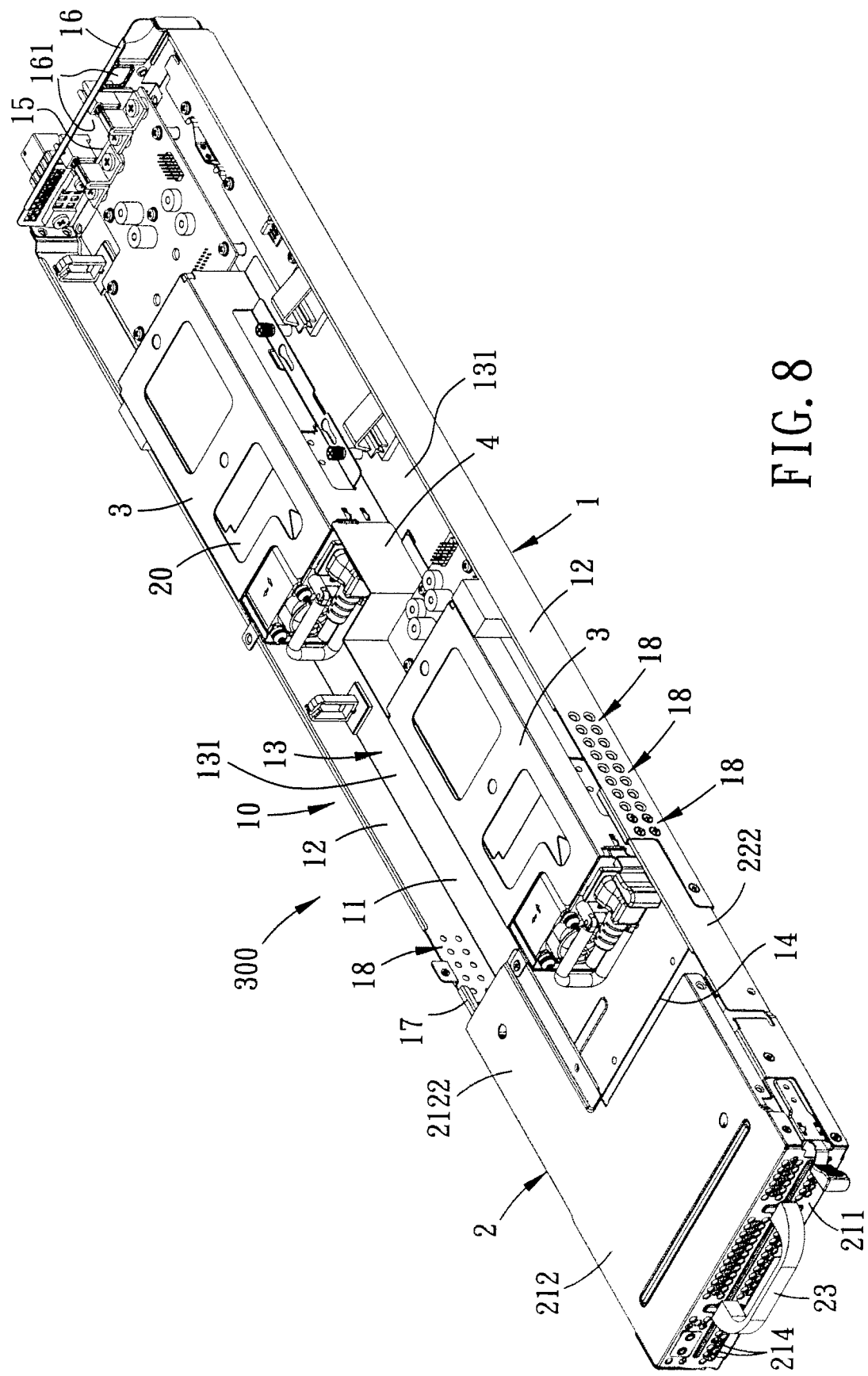
FIG. 8 is a view similar to FIG. 2, but illustrating an alternative form of a first positioning portion of the carrier.
Figure 9:
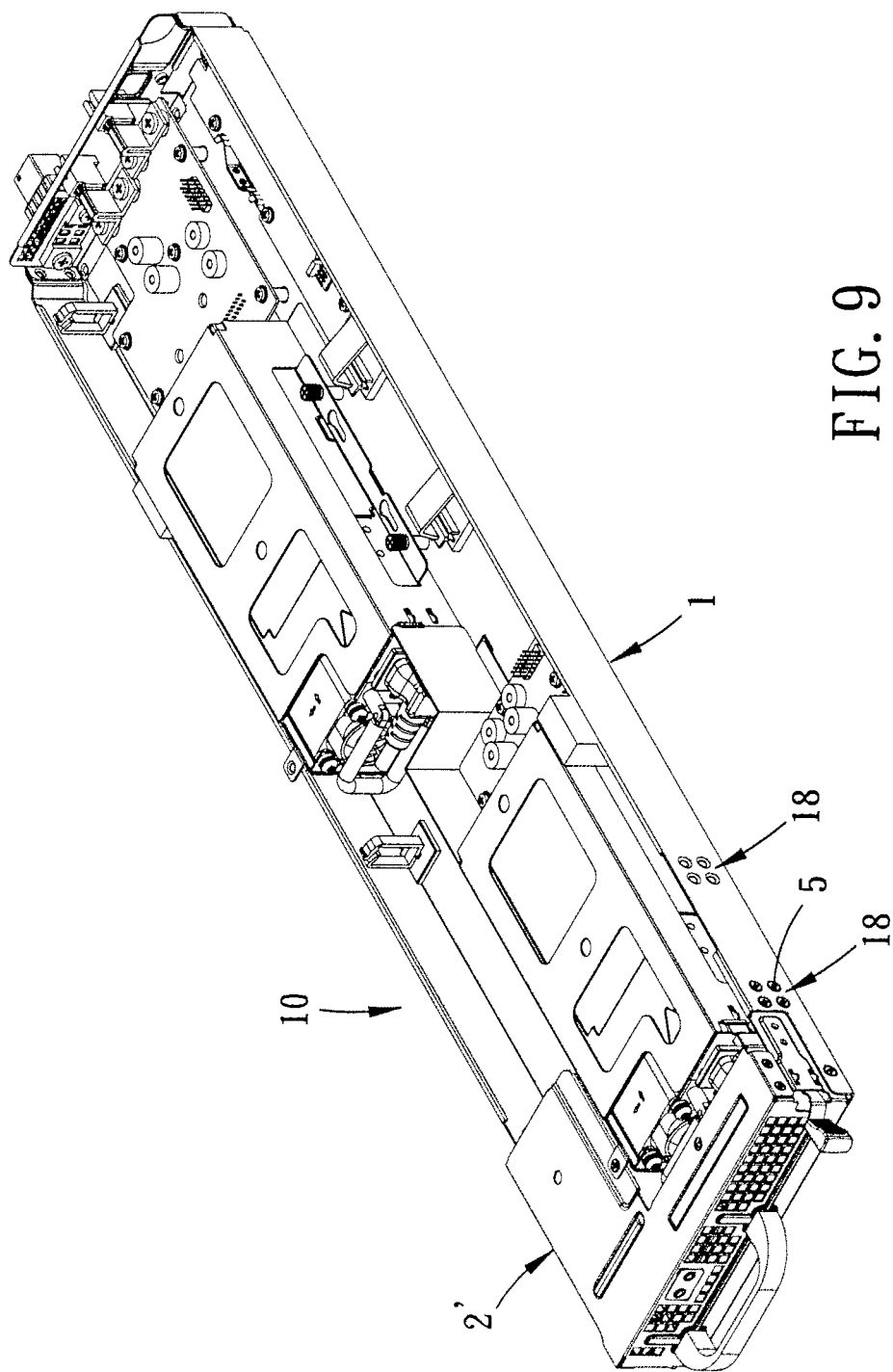
FIG. 9 is a view similar to FIG. 2, but illustrating an alternative form of the front shell.

Referring to FIG. 8, the first positioning portions 18 that are located on the same first sidewall 12 may be arranged immediately adjacent each other, so that the length of the carrier 10 may be finely adjusted. Similarly, in an alternative embodiment, the carrier body 1 may include one pair of the first positioning portions 18, and the front shell 2 may include a plurality of pairs of the second positioning portions 26. Or, the carrier body 1 may include a plurality of pairs of the first positioning portions 18 and the front shell 2 may include a plurality of pairs of the second positioning portions 26. Furthermore, referring to FIG. 9, in another alternative embodiment, a shorter front shell 2' may be connected to the carrier body 1 so as to shorten the entire length of the carrier 10.

The aforesaid carrier 10 is not limited to be loaded with the power supplies 20, and may be loaded with other devices that are used in the server, such as a storage device, etc. Moreover, only one power module 300 may be disposed in the server.

To sum up, when the carrier body 1 and the front shell 2 are assembled, the entire length of the carrier 10 may be adjusted by adjusting the overlapping areas of the connecting walls 222 of the front shell 2 and the first sidewalls 12 of the carrier body 1, thereby realizing the applicability of the present disclosure to the chassis 100 having the receiving space 101 of different depths. Thus, the use flexibility of the carrier 10 or the power module 300 may be enhanced.

While the present disclosure has been described in connection with what is considered the most practical embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A carrier for installation in a receiving space of a chassis of a server, comprising:
    a carrier body including a rectangular first bottom wall and two first sidewalls that extend upwardly and respectively from two opposite long sides of said first bottom wall, said first bottom wall and said first sidewalls cooperatively defining a carrying space, said first bottom wall having one short side that defines a front side of said carrier body and the other short side that defines a rear side of said carrier body; and
    a front shell connected to said front side of said carrier body, and including an upper shell having a front cover plate, a handgrip disposed on said front cover plate, and two connecting walls, said connecting walls extending into said carrying space from said front side of said carrier body and being respectively and adjustably connected to said first sidewalls in an overlapping manner to adjust a distance between said front cover plate and said rear side of said carrier body, so that the length of said carrier corresponds to the depth of the receiving space of the chassis.

2. The carrier of claim 1, wherein said carrier body further includes a plurality of pairs of first positioning portions, each pair of said first positioning portions being respectively provided on said first sidewalls, said first positioning portions that are located on the same one of said first sidewalls being arranged spaced apart from each other along the length of said corresponding first sidewall, said front shell further including a pair of second positioning portions that are respectively provided on said connecting walls and that are selectively connected to one of said pairs of said first positioning portions.

3. The carrier of claim 2, wherein each of said first and second positioning portions includes a plurality of through holes, said through holes in each said first positioning portion being disposed in a position corresponding to that of said through holes in each said second positioning portion.

4. The carrier of claim 1, wherein said front cover plate of said upper shell has a plurality of passage holes, said front shell further including a lower shell that is connected to said upper shell and that cooperates with the same to define a flow guide space, said lower shell having said connecting walls.

5. The carrier of claim 4, wherein said upper shell further has a top wall and a second sidewall, said top wall being connected to a top end of said front cover plate and being oppositely spaced apart from said first bottom wall, said second sidewall being connected to one side of said front cover plate and a corresponding side of said top wall, said lower shell further having a second bottom wall that is connected to said front cover plate opposite to said top wall, said connecting walls being respectively connected to two opposite sides of said second bottom wall, said second sidewall being connected to a corresponding one of said connecting walls.

6. The carrier of claim 1, wherein said carrier body further includes a pair of stop pieces that are respectively connected to said first sidewalls and that are spaced apart from said first bottom wall, said pair of stop pieces cooperating with said first bottom wall to define a pair of guide rails to receive said connecting walls, respectively.

7. A power module for a server, comprising:
a carrier including
a carrier body including a rectangular first bottom wall and two first sidewalls that extend upwardly and respectively from two opposite long sides of said first bottom wall, said first bottom wall and said first sidewalls cooperatively defining a carrying space, said first bottom wall having one short side that defines a front side of said carrier body and the other short side that defines a rear side of said carrier body, and
a front shell connected to said front side of said carrier body, and including an upper shell having a front cover plate, a handgrip disposed on said front cover plate, and two connecting walls, said connecting walls extending into said carrying space from said front side of said carrier body and being respectively and adjustably connected to said first sidewalls in an overlapping manner to adjust a distance between said front cover plate and said rear side of said carrier body; and
two power supplies spaced apart in a front-rear direction and disposed on said first bottom wall in proximity to said first sidewalls, respectively.

8. The power module of claim 7, wherein said carrier body further includes a plurality of pairs of first positioning portions, each pair of said first positioning portions being respectively provided on said first sidewalls, said first positioning portions that are located on the same one of said first sidewalls being arranged spaced apart from each other along the length of said corresponding first sidewall, said front shell further including a pair of second positioning portions that are respectively provided on said connecting walls and that are selectively connected to one of said pairs of said first positioning portions.

9. The power module of claim 8, wherein each of said first and second positioning portions includes a plurality of through holes, said through holes in each said first positioning portion being disposed in a position corresponding to that of said through holes in each said second positioning portion.

10. The power module of claim 7, wherein said front cover plate of said upper shell includes a plurality of passage holes, said front shell further including a lower shell that is connected to said upper shell and that cooperates with the same to define a flow guide space, said lower shell having said connecting walls.

11. The power module of claim 10, wherein said carrier further includes two limiting shells and a divider, said limiting shells being spaced apart in a front-rear direction, being fixed to said first bottom wall in proximity to said first sidewalls, respectively, and respectively accommodating said power supplies, said divider being connected between sides of said limiting shells that are distal from said first sidewalls to partition said carrying space into two air passages, said air passages respectively extending through said power supplies.

12. The power module of claim 11, wherein said upper shell further has a top wall and a second sidewall, said top wall being L-shaped and being oppositely spaced apart from said first bottom wall of said carrier body, said top wall including a main portion connected to said front cover plate, and an extension portion extending rearwardly from a part of said main portion, said extension portion and said carrier body cooperatively defining an air passage that corresponds to one of said power supplies which is disposed in proximity to said rear side of said carrier body, said second sidewall being connected to one end of said front cover plate and a corresponding end of said top wall, said lower shell further having a second bottom wall that is oppositely spaced apart from said top wall and that has a front side connected to said front cover plate, said connecting walls being respectively connected to two opposite sides of said second bottom wall, said second sidewall being connected to a corresponding one of said connecting walls.

13. The power module of claim 7, wherein said carrier body further includes a pair of stop pieces that are respectively connected to said first sidewalls and that are spaced apart from said first bottom wall, said pair of stop pieces cooperating with said first bottom wall to define a pair of guide rails to receive said connecting walls, respectively.

14. A server, comprising:
a chassis defining a receiving space and an opening in spatial communication with said receiving space;
a heat dissipation module disposed on said chassis opposite to said opening; and
at least one power module accommodated in said receiving space of said chassis and including a carrier and two power supplies, said carrier including
a carrier body including a rectangular first bottom wall and two first sidewalls that extend upwardly and respectively from two opposite long sides of said first bottom wall, said first bottom wall and said first sidewalls cooperatively defining a carrying space, said first bottom wall having one short side that defines a front side of said carrier body and the other short side that defines a rear side of said carrier body, said rear side of said carrier body being proximate to said heat dissipation module, said power supplies being spaced apart in a front-rear direction and being disposed on said first bottom wall in proximity to said first sidewalls, respectively, and
a front shell connected to said front side of said carrier, and including an upper shell having a front cover plate, a handgrip disposed on said front cover plate, and two connecting walls, said connecting walls extending into said carrying space from said front side of said carrier body and being respectively and adjustably connected to said first sidewall in an overlapping manner to adjust a distance between said front cover plate and said rear side of said carrier body, so that the length of said carrier corresponds to the depth of said receiving space of said chassis and said front cover plate is located at said opening.

15. The server of claim 14, wherein said carrier body further includes a plurality of pairs of first positioning portions, each pair of said first positioning portions being respectively provided on said first sidewalls, said first positioning portions that are located on the same one of said first sidewalls being arranged spaced apart from each other along the length of said corresponding first sidewall, said front shell further including a pair of second positioning portions that are respectively provided on said connecting walls and that are selectively connected to one of said pairs of said first positioning portions.

16. The server of claim 15, wherein each of said first and second positioning portions includes a plurality of through holes, said through holes in each said first positioning portion being disposed in a position corresponding to that of said through holes in each said second positioning portion.

17. The server of claim 14, wherein said front cover plate of said upper shell includes a plurality of passage holes, said front shell further including a lower shell that is connected to said upper shell and that cooperates with the same to define a flow guide space, said lower shell having said connecting walls.

18. The server of claim 17, wherein said carrier further includes two limiting shells and a divider, said limiting shells being spaced apart in a front-rear direction, being connected to said first bottom wall in proximity to said first sidewalls, respectively, and respectively accommodating said power supplies, said divider being connected between sides of said limiting shells that are distal from said first sidewalls to partition said carrying space into two air passages, said air passages respectively extending through said power supplies.

19. The server of claim 18, wherein said upper shell further has a top wall and a second sidewall, said top wall being L-shaped and being oppositely spaced apart from said first bottom wall of said carrier body, said top wall including a main portion connected to said front cover plate, and an extension portion extending rearwardly from a part of said main portion, said extension portion and said carrier body cooperatively defining an air passage that corresponds to one of said power supplies which is disposed in proximity to said rear side of said carrier body, said second sidewall being connected to one end of said front cover plate and a corresponding end of said top wall, said lower shell further having a second bottom wall that is oppositely spaced apart from said top wall and that has a front side connected to said front cover plate, said connecting walls being respectively connected to two opposite sides of said second bottom wall, said second sidewall being connected to a corresponding one of said connecting walls.

20. The server of claim 14, wherein said carrier body further includes a pair of stop pieces that are respectively connected to said first sidewalls and that are spaced apart from said first bottom wall, said pair of stop pieces cooperating with said first bottom wall to define a pair of guide rails to receive said connecting walls, respectively.

* * * * *